(12) United States Patent
Payton

(10) Patent No.: US 6,351,383 B1
(45) Date of Patent: Feb. 26, 2002

(54) HEAT CONDUCTING DEVICE FOR A CIRCUIT BOARD

(75) Inventor: Albert P. Payton, Sachse, TX (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/389,655

(22) Filed: Sep. 2, 1999

(51) Int. Cl.⁷ .................................................. H05K 7/20
(52) U.S. Cl. ..................... 361/704; 361/721; 361/744; 361/790; 361/735; 165/80.3; 211/41.1
(58) Field of Search ................................. 361/704, 707, 361/709, 710, 716–721, 729, 730, 735; 24/524–528; 403/409.1; 254/104; 174/16.3; 165/80.3, 185; 639/65, 64, 487

(56) References Cited

U.S. PATENT DOCUMENTS

| | | | |
|---|---|---|---|
| 3,013,745 A | * 12/1961 | Galway et al. | ............ 174/15.1 |
| 3,796,254 A | * 3/1974 | Stooksberry et al. | ......... 165/47 |
| 4,304,294 A | 12/1981 | Reisman et al. | ............. 165/32 |
| 4,442,475 A | * 4/1984 | Franklin et al. | ............. 361/690 |
| 4,858,068 A | * 8/1989 | Bitller et al. | ................ 361/679 |
| 4,903,603 A | * 2/1990 | Longerich et al. | ......... 102/293 |
| 5,060,115 A | 10/1991 | Sewell | ........................ 361/388 |
| 5,105,337 A | * 4/1992 | Bitller et al. | ................ 361/722 |
| 5,251,099 A | * 10/1993 | Goss et al. | ................. 361/721 |
| 5,284,095 A | 2/1994 | Sabah | ........................ 102/293 |
| 5,621,617 A | * 4/1997 | Goss et al. | ................. 361/721 |
| 6,119,573 A | * 9/2000 | Berens et al. | ............... 89/1.816 |

FOREIGN PATENT DOCUMENTS

EP 0 584 669 A1 3/1994 ............ H05K/7/14

* cited by examiner

Primary Examiner—Leo P. Picard
Assistant Examiner—Boris L. Chervinsky
(74) Attorney, Agent, or Firm—Baker Botts L.L.P.

(57) ABSTRACT

A heat conducting device for providing a thermal path between a circuit board and a missile airframe includes a thermal plane that is adapted to receive a circuit board and a collar that encompasses at least a portion of the thermal plane. The collar has a first position that disengages the heat conducting device from at least a portion of the airframe and a second position that engages the heat conducting device with at least a portion of the airframe to provide a thermal path between the circuit board and the airframe.

17 Claims, 5 Drawing Sheets

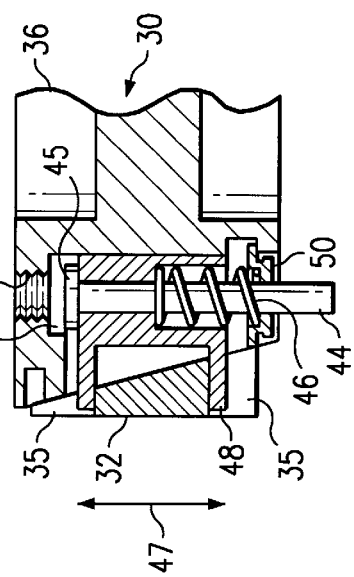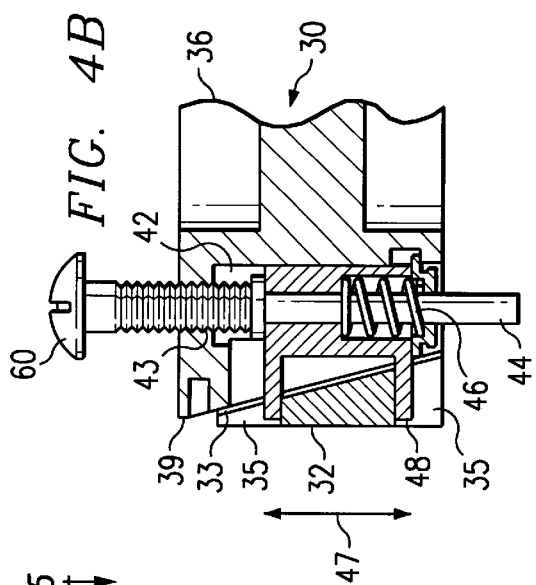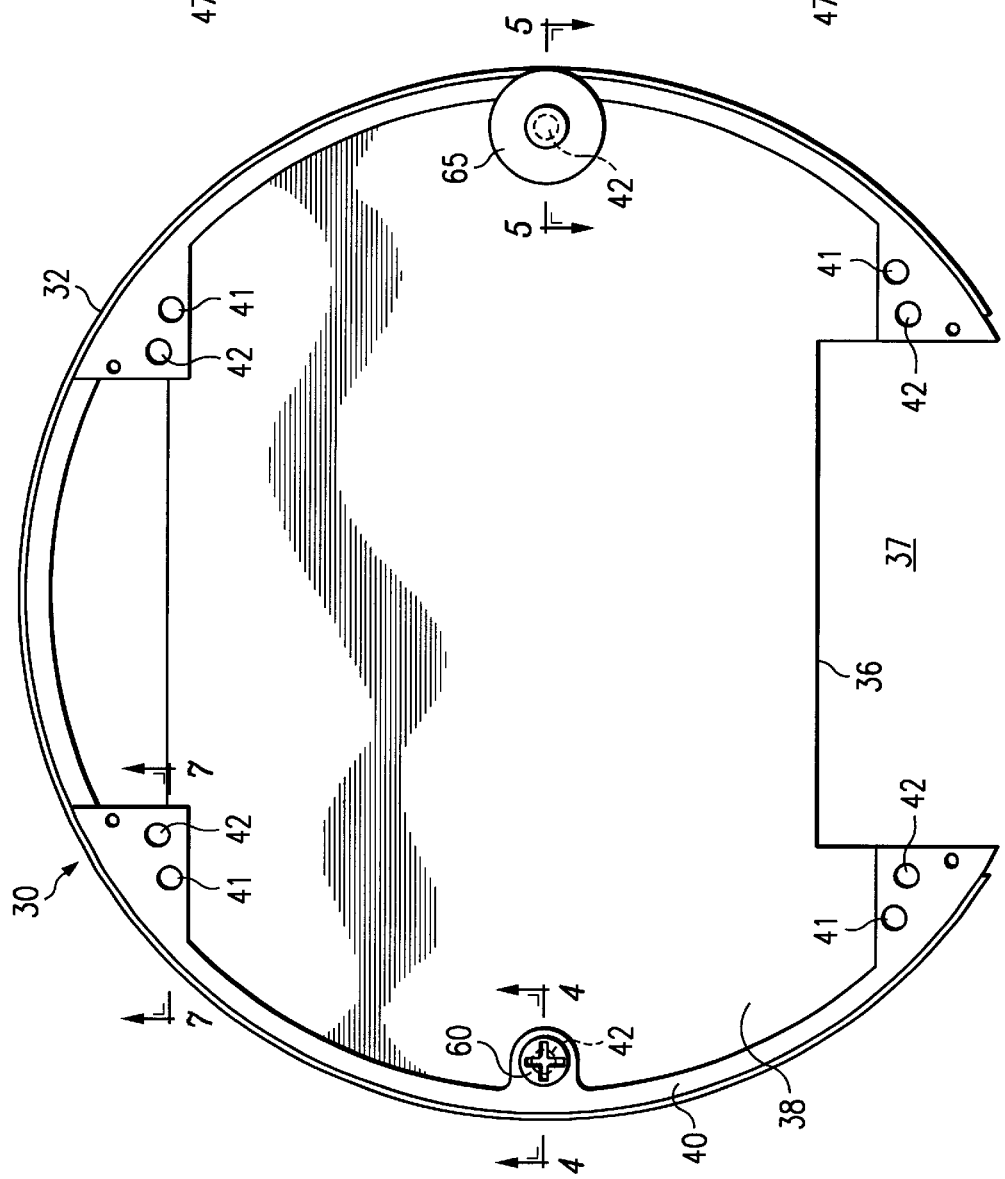

HEAT CONDUCTING DEVICE FOR A CIRCUIT BOARD

TECHNICAL FIELD OF THE INVENTION

This invention relates to heat conducting devices, and more particularly to a heat conducting device for a circuit board.

BACKGROUND OF THE INVENTION

A circuit board (CB) located in a missile contains electronics mounted on and through the CB. The electronics themselves generate heat, and the CB may also experience an influx of aerodynamic heat through the airframe of the missile during high speed flight. Both internal and external sources of heat may degrade the operation of the CB and the electronics.

In many older missiles, the influx of heat during high speed flight was the primary concern because the electronics did not produce large amounts of heat. Accordingly, missiles that had short duration high speed flights were designed to limit the influx of heat during that mode of operation. These designs, however, did not allow for the removal of heat from the missile. Thus, as the electronics have become more complex and have begun to operate for longer periods of time, internal heat has become a concern too. Thus, CBs in some modern missiles may generate significant internal heat and also experience significant heating from the airframe during high speed flight.

SUMMARY OF THE INVENTION

The present invention substantially reduces or eliminates at least some of the disadvantages and problems associated with circuit boards (CBs) in missiles. The present invention can provide a heat conducting device with a low impedance thermal path for the heat generated by the electronics on the CB in one mode of operation of the missile and a high impedance thermal path for the heat generated by the aerodynamics on the airframe in another mode of operation of the missile.

In one embodiment of the present invention, a heat conducting device for providing a thermal path between a circuit board and an airframe includes a thermal plane adapted to receive a circuit board and a collar encompassing at least a portion of the thermal plane. The collar has a first position to disengage from at least a portion of the airframe and a second position to engage at least a portion of the airframe to provide a thermal path between the circuit board and the airframe.

In another embodiment, a method for providing a thermal path between a circuit board and an airframe includes mounting a circuit board on a thermal plane and disposing a collar around at least a portion of the thermal plane. The method also includes placing the collar in a first position to disengage from at least a portion of the airframe and placing the collar in a second position to engage at least a portion of the airframe to provide a thermal path between the circuit board and the airframe.

The present invention has several important technical features and advantages. First, because the outside perimeter of the heat conducting device contracts when the collar is placed in the disengaged position, the collar allows for efficient insertion of the heat conducting device into a missile when being assembled. Second, the collar and, hence, the heat conducting device engaging with at least a portion of the airframe when the collar is in the engaged position provides a low impedance thermal path between the CB and the airframe for the heat generated by the electronics on the CB during one mode of operation of a missile, such as during captive flight of an air-to-air missile. The heat conducts through the thermal plane and the collar to the airframe, where it discharges to the ambient surroundings. In certain embodiments, the collar can again be placed in the disengaged position, which raises the impedance of the thermal path between the CB and the airframe during another mode of operation of a missile, such as high speed free flight of an air-to-air missile. This protects the CB and the electronics from influxing aerodynamic heat.

In a particular embodiment, the thermal plane has a shape similar to a lateral cross-section of the missile, allowing the CB and the thermal plane to mount perpendicular to the longitudinal axis of the missile. This shape allows for a more uniform design of the heat conducting devices and the CBs and provides a more structurally sound support for the CBs, compared to CB mountings parallel to the longitudinal axis of the missile.

In further embodiments, multiple heat conducting devices can couple together to form an assembly of heat conducting devices before insertion into a missile, during assembly or when the electronics are being repaired and reinstalled. This permits efficient interconnection between the electronics on CBs on different heat conducting devices in the assembly. As before, placing the collars in the disengaged position allows for efficient insertion of the heat conducting devices in the assembly into the missile. After mounting the assembly in the airframe, placing the collars, individually or as a group, in the engaged position engages them with at least a portion of the airframe, providing a low impedance thermal path for the heat generated by the electronics on the CBs during one mode of operation of a missile. In some of these embodiments, an actuator disengages all of the collars in the assembly from at least a portion of the airframe during another mode of operation of a missile.

In a particular embodiment, the heat conducting devices in the assembly can move laterally to the longitudinal axis of the missile independently of each other when the collars are disengaged. Thus, the heat conducting devices can independently center when engaging the airframe.

Other technical advantages will be readily apparent to one skilled in the art from the following figures, description, and claims.

BRIEF DESCRIPTION OF THE DRAWINGS

For a more complete understanding of the present invention, and for further features and advantages, reference is now made to the following description taken in conjunction with the accompanying drawings, where like reference numerals represent like parts, in which:

FIG. 3 shows a top view of a thermal plane and a collar of a heat conducting device;

FIG. 4A provides a cut-away view of the thermal plane and the collar along section line 4—4 with no actuation device inserted into the thermal plane;

FIG. 4B provides a cut-away view of the thermal plane and the collar along section line 4—4 with a screw used as the actuation device;

DETAILED DESCRIPTION OF THE INVENTION

Figure 1:
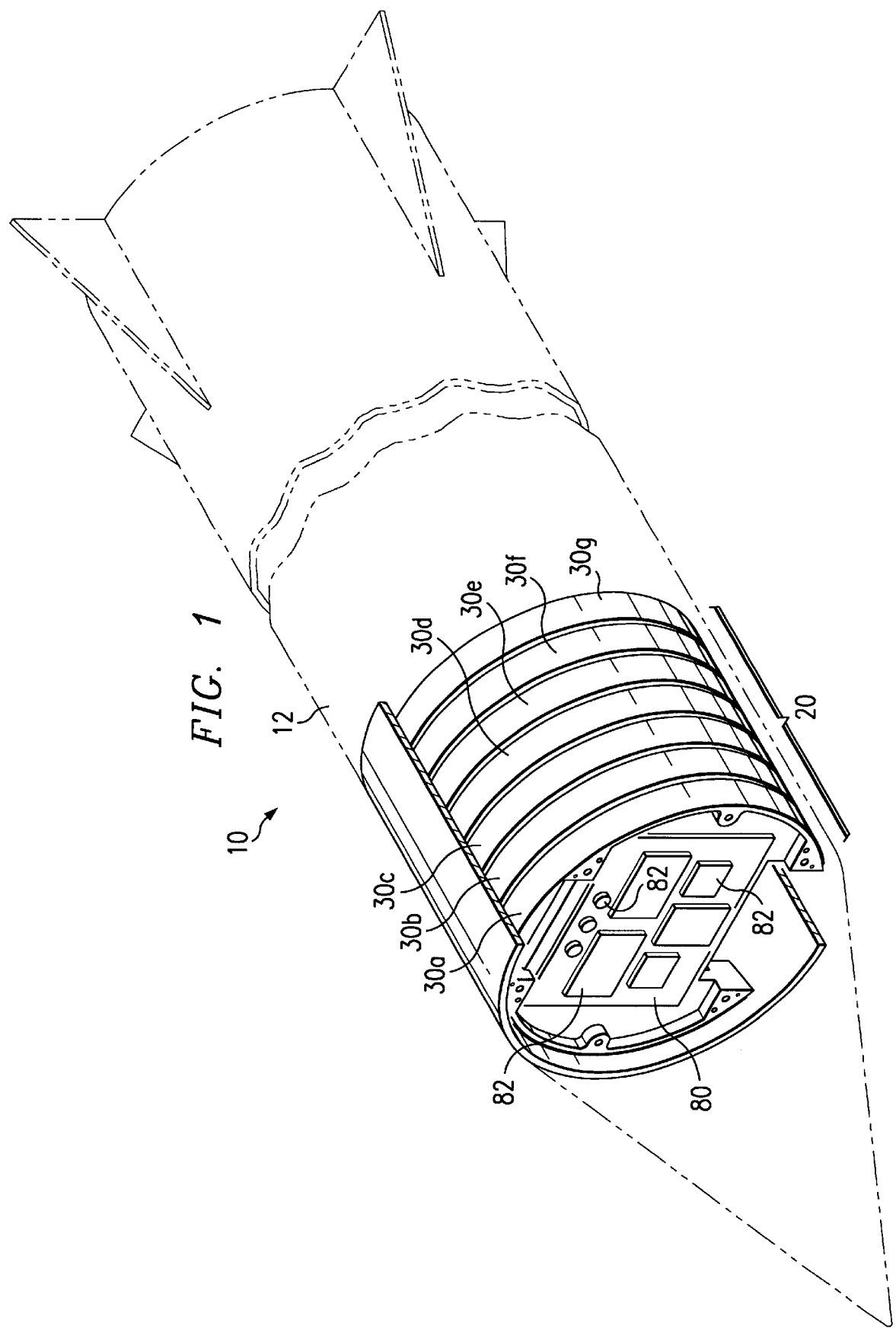
FIG. 1 shows an assembly of heat conducting devices mounted in a missile.

FIG. 1 shows an assembly 20 of heat conducting devices 30a, 30b, 30c, 30d, 30e, 30f, and 30g (generally referred to as heat conducting device 30) mounted in a missile 10. Note, assembly 20 may have any number of heat conducting devices 30. A circuit board (CB) 80 mounts onto heat conducting device 30 and contains a variety of electronic devices 82, which could include integrated circuits, microprocessors, active radar components, or any other type of electronic device. CB 80 can be a printed circuit board, a printed wafer board, or any other substrate on which electronic devices 82 may be mounted and/or interconnected. CB 80 can be composed of plastic, fiberglass, or composite. In a particular embodiment, CB 80 is composed of FR-4.

Electronic devices 82 and CB 80 must be protected from influxing aerodynamic heat from an airframe 12 of missile 10 during certain modes of operation of missile 10, but still be able to dissipate heat generated by electronic devices 82 during other modes of operation of missile 10. To accomplish this, heat conducting device 30 can disengage from airframe 12 of missile 10 and can engage with airframe 12 of missile 10. By disengaging from airframe 12, heat conducting device 30 provides a high impedance thermal path between CB 80 and airframe 12 for heat from airframe 12 of missile 10, but by engaging with airframe 12, heat conducting device 30 provides a low impedance thermal path between CB 80 and airframe 12 for heat generated by electronic devices 82 on CB 80. Airframe 12 can be the skin of missile 10, a spar of missile 10, a bulkhead of missile 10, or any other structural component of missile 10 that provides a thermal path to transfer heat generated by heat conducting device 30.

In operation, heat conducting device 30 is in the disengaged mode, which contracts its outside perimeter, during insertion into missile 10. After insertion and mounting, heat conducting device 30 expands to engage airframe 12 of missile 10. Engaging airframe 12 provides a low impedance thermal path for transferring the heat generated by electronic devices 82 on CB 80 to airframe 12, where it discharges to the ambient surroundings, such as the atmosphere, during certain modes of operation of missile 10. For other modes of operation of missile 10, heat conducting device 30 disengages from airframe 12, by contracting again, to insulate CB 80 from heat, such as aerodynamic heat, on airframe 12. Each heat conducting device 30 in assembly 20 can expand and contract to engage and disengage, respectively, with airframe 12.

In particular embodiments, heat conducting device 30 has a shape similar to a lateral cross-section of airframe 12. This allows for a uniform design for heat conducting device 30 and/or CB 80. Also, this shape allows heat conducting device 30 to mount perpendicular to the longitudinal axis of airframe 12, which provides a sound structural support for CB 80.

Heat conducting device 30 is particularly useful in air-to-air missiles, where there are long periods during which missile 10 is attached to an aircraft, so called "captive flight," usually at relative low flight speeds, and short periods during which missile 10 is flying under its own power, so called "free flight," usually at relatively high flight speeds. Although electronic devices 82 can be active in both operational modes of missile 10, thereby producing heat, engaging heat conducting device 30 with airframe 12 during captive flight allows the heat generated by electronic devices 30 to discharge to the atmosphere. On the other hand, disengaging heat conducting device 30 from airframe 12 during free flight allows CB 80 and electronic devices 82 to be protected from influxing aerodynamic heat during the relatively short free flight. Note, the mass of heat conducting device 30 assists in providing this protection by absorbing sufficient heat to ensure that the electronic devices 82 on CB 80 do not have excessive temperatures.

Figure 2:
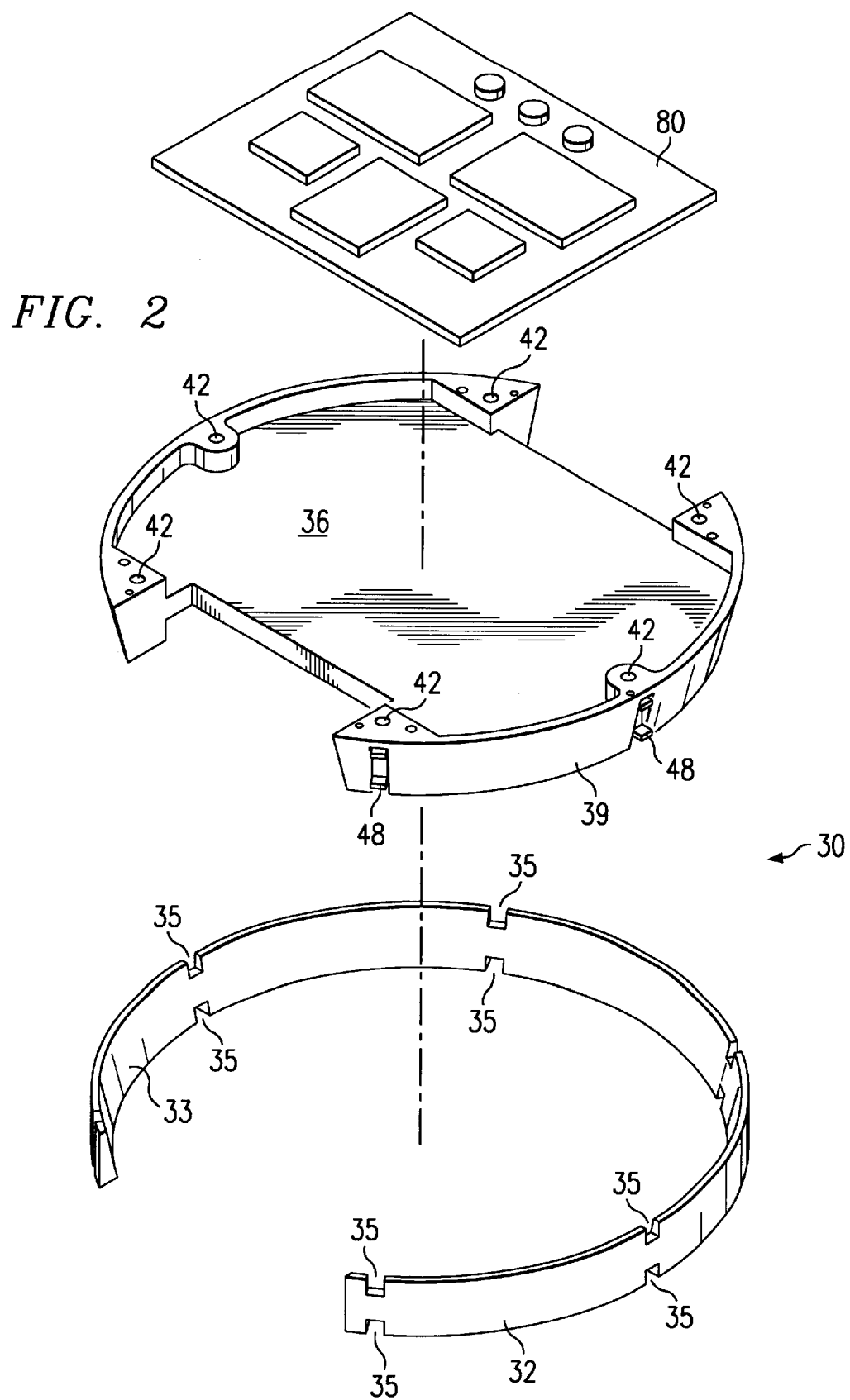
FIG. 2 shows an exploded view of a heat conducting device and a circuit board.

FIG. 2 shows an exploded view of heat conducting device 30 and CB 80. As can now be seen, heat conducting device 30 includes a collar 32 and a thermal plane 36. Collar 32 encompasses at least a portion of thermal plane 36 and possesses a series of notches 35 and a tapered inside perimeter 33. Thermal plane 36 includes a tapered outside perimeter 39 that corresponds to tapered inside perimeter 33 of collar 32. Thermal plane 36 also includes apertures 42 and tensioners 48 in apertures 42. Tensioners 48 engage collar 32 in notches 35. Collar 32 and thermal plane 36 may be composed of aluminum, copper, or any other metal that possesses a good thermal conductivity. CB 80 mounts onto thermal plane 36. In certain embodiments, two CBs 80 may mount on thermal plane 36, one on either side.

In operation, tensioners 48 in apertures 42 of thermal plane 36 engage collar 32 in notches 35. Thus, as tensioners 48 move substantially perpendicular to thermal plane 36, collar 32 moves between the disengaged and engaged positions, disengaging and engaging heat conducting device 30 with airframe 12 of missile 10. Note, collar 32 does not require continuous contact with airframe 12 to engage airframe 12, and thus, collar 32 may only contact airframe 12 at a discrete number of points and still provide a low impedance thermal path between CB 80 and airframe 12. In addition, when collar 32 disengages from airframe 12, it may continue to contact airframe 12 at a discrete number of points and still provide a high impedance thermal path.

Note, collar 32 may sometimes disengage from thermal plane 36 and remain engaged with airframe 12 when moved into the disengaged position. Thus, when moved back into the engaged position, collar 32 will engage with thermal plane 36. Additionally, collar 32 may sometimes disengage from thermal plane 36 and airframe 12 when moved into the disengaged position. Thus, when moved back into the engaged position, collar 32 will engage thermal plane 36 and airframe 12. When collar 32 disengages in either of these manners, however, heat conducting device 30 still provides a high impedance thermal path between airframe 12 and circuit board 80.

FIG. 3 shows a top view of thermal plane 36 and collar 32 of heat conducting device 30. Thermal plane 36 contains a generally level surface 38 upon which CB 80 (not shown) mounts and a ridge 40 that forms the perimeter of thermal plane 36. Ridge 40 protects electronic devices 82 on CB 80 from an adjacent heat conducting device 30 in assembly 20, provides mounting boundaries for CB 80, enhances structural rigidity of heat conducting device 30, and gives tapered outside perimeter 39 enough depth to accommodate the movements of collar 32. As shown, ridge 40 and collar 32 are truncated, forming an aperture 37 in heat conducting device 30. Aperture 37 provides a path for couplers between CB 80 and other CBs 80 on heat conducting devices 30 in assembly 20. In certain embodiments, structural supports can couple to heat conducting device 30 through aperture 37. Ridge 40 also contains apertures 42, which contain tensioners 48 (not shown), and apertures 41, used in coupling heat conducting device 30 to other heat conducting devices 30 in assembly 20. One of apertures 42 is shown with a screw 60 inserted, and one of apertures 42 is shown with an actuator 65 inserted. Screw 60 and actuator 65 are representative of actuation devices that can actuate tensioners 48 in apertures 42, disengaging and engaging collar 32.

FIG. 4A provides a cut-away view of thermal plane 36 and collar 32 along section line 4—4 with screw 60 extracted from thermal plane 36. As can now be seen, thermal plane 36 also includes threads 43, a plunger 44, a spring 46, and a retainer 50 in each aperture 42. Plunger 44 has a head 45 at one end and extends through an aperture in spring 46, tensioner 48, and retainer 50. In embodiments discussed below, the end of plunger 44 opposite head 45 can engage plunger 44 in an adjacent heat conducting device 30 in assembly 20. Plunger 44 engages tensioner 48 by means of head 45. Tensioner 48 in turn engages collar 32 in notches 35 in collar 32. Tensioner 48 also engages spring 46, which is held in place on one end by retainer 50. Spring 46 may be a coiled spring, a flexible lever, or any other device that provides a restorative force to tensioner 48. In certain embodiments, spring 46 may compensate for temperature.

Collar 32 is engaged with at least a portion of airframe 12 in the absence of forces applied by an actuating device. In this condition, spring 46 moves tensioner 48 toward threads 43, which in turn moves collar 32 substantially perpendicular to thermal plane 36, as indicated by arrow 47. Thus, the perimeter of heat conducting device 30 expands to engage at least a portion of airframe 12 (not shown) of missile 10 when no force is applied by an actuating device, creating a low impedance thermal path for transferring heat generated by electronic devices 82 on CB 80 to the ambient surroundings.

FIG. 4B provides a cut-away view of thermal plane 36 and collar 32 along section line 4—4 with screw 60 inserted into thermal plane 36. Screw 60 can serve as an actuating device to disengage and engage collar 32 with airframe 12. To disengage collar 32 from airframe 12, screw 60 inserts into aperture 42 and engages threads 43 and, subsequently, plunger 44, which engages tensioner 48. The insertion of screw 60 into aperture 42 moves plunger 44, which in turn moves tensioner 48. As tensioner 48 moves, it compresses spring 46 and moves collar 32 substantially perpendicular to thermal plane 36, as indicated by arrow 47, due to the engagement with collar 32 in notches 35. Note, in other embodiments, tensioner 48 may extend into more or fewer notches 35 in collar 32. As screw 60 moves collar 32 substantially perpendicular to thermal plane 36, the perimeter of heat conducting device 30 contracts due to the interaction of tapered inside perimeter 33 of collar 32 with tapered outside perimeter 39 of thermal plane 36. Thus, heat conducting device 30 disengages from at least a portion of airframe 12 (not shown). The disengagement creates a high impedance thermal path for heat from airframe 12, as an air gap forms between at least portions of collar 32 and airframe 12. This high impedance thermal path between airframe 12 and CB 80 impedes the influx of heat to CB 80 during high speed flight, or in any other mode of operation of missile 10 in which heat influxes from airframe 12. The contraction also provides an efficient way to insert heat conducting device 30 into missile 10.

In other embodiments, thermal plane 36 could also include a phase change material to assist in impeding the influx of heat from airframe 12 during free flight. In still other embodiments, missile 10 could also use active cooling, e.g., a circulated or expended liquid.

Figure 5A:
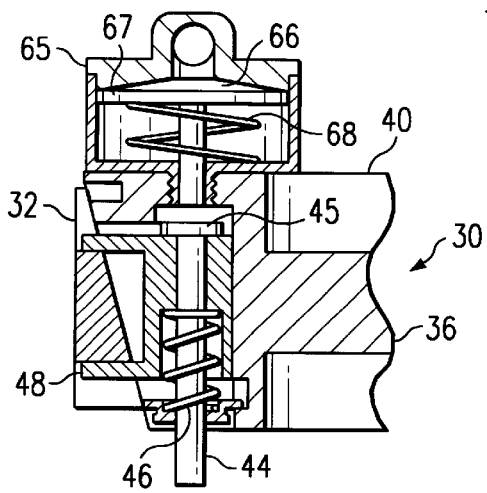
FIG. 5A provides a cut-away view of the thermal plane and the collar along section line 5—5 with an actuator used as the actuation device.

FIG. 5A provides a cut-away view of thermal plane 36 and collar 32 along section line 5—5 with actuator 65 used as the actuation device. As illustrated, actuator 65 is a pneumatic actuator, which includes a cavity 66, a plunger 67, and a spring 68. But note, actuator 65 could also be an electrical solenoid, a motorized screw, a preloaded spring plunger assembly that is released by an electrically initiated pyrotechnic element, or any other mechanized device that can move plunger 44.

Actuator 65 is shown disengaged in FIG. 5A, meaning that collar 32 is engaged with airframe 12 (not shown). When actuator 65 is disengaged, spring 68 moves plunger 67, which forces air out of cavity 66. The movement of plunger 67 by spring 68 disengages plunger 67 from plunger 44 of thermal plane 36, which allows spring 46 to move tensioner 48 toward actuator 65. Tensioner 48 correspondingly moves collar 32, which expands the perimeter of heat conducting device 30. Thus, when actuator 65 is disengaged, collar 32 engages with at least a portion of airframe 12 of missile 10. Note, head 45 of plunger 44 floats freely between ridge 40 and tensioner 48 when actuator 65 is disengaged because the ends of plunger 44 are not connected to anything. This allows collar 32 to compensate for variations in airframe 12.

Figure 5B:
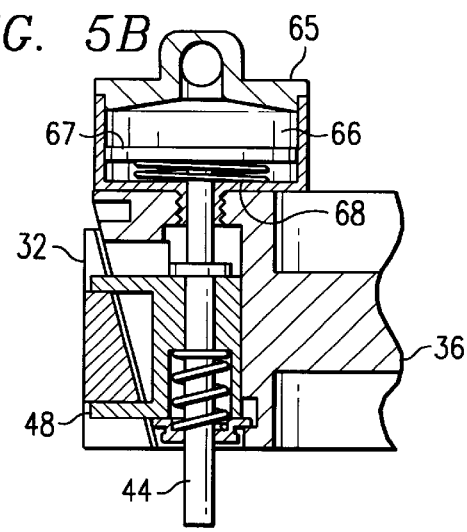
FIG. 5B provides a cut-away view of the thermal plane and the collar along section line 5—5 with the actuator engaged.

FIG. 5B provides a cut-away view of thermal plane 36 and collar 32 along section line 5—5 with actuator 65 engaged. Actuator 65 engages by having air pumped into cavity 66. This forces plunger 67 to move spring 68 and plunger 44. Plunger 44 in turn moves tensioner 48, which moves collar 32. Thus, when actuator 65 engages thermal plane 36, collar 32 disengages from at least a portion of airframe 12 of missile 10.

Figure 6A:
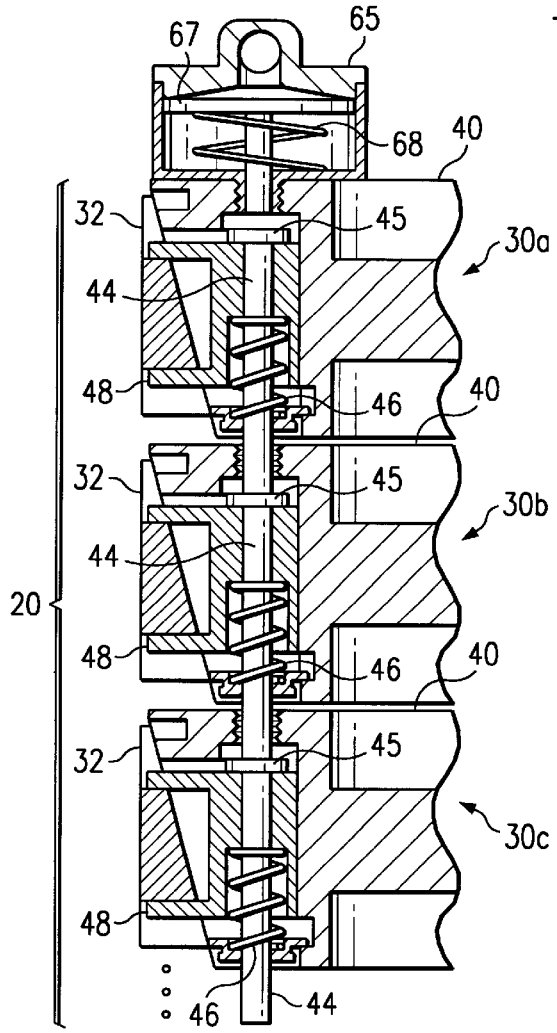
FIG. 6A provides a cut-away view of an assembly of heat conducting devices along section line 5—5 with an actuator used as the actuation device.

FIG. 6A provides a cut-away view of assembly 20 of heat conducting devices 30 along section line 5—5 with actuator 65 used as the actuation device. In this embodiment, actuator 65 is again a pneumatic actuator and can disengage and engage collar 32 for each heat conducting device 30a–30g with at least a portion of airframe 12. As presently shown, however, actuator 65 is disengaged. With actuator 65 disengaged, spring 68 moves plunger 67, away from plunger 44 of heat conducting device 30a. As before, this allows spring 46 of heat conducting device 30a to move tensioner 48 of heat conducting device 30a, which in turn moves collar 32 of heat conducting device 30a. In this embodiment, however, this sequence also occurs for plunger 44, spring 46, tensioner 48, and collar 32 in heat conducting devices 30b–30g in assembly 20, allowing collar 32 of each heat conducting device 30b–30g to engage airframe 12 of missile 10. Thus, when actuator 65 disengages each heat conducting device 30a–30g engages airframe 12.

Note, head 45 of plunger 44 of each heat conducting device 30a–30g floats freely between ridge 40 and each tensioner 48 of each heat conducting device 30a–30g in this arrangement because the ends of each plunger 44 are not connected to anything. Therefore, each heat conducting device 30a–30g can independently engage airframe 12 of missile 10 because each tensioner 48 does not affect any other tensioner 48. This allows each heat conducting device 30a–30g to independently compensate for variations of airframe 12.

Figure 6B:
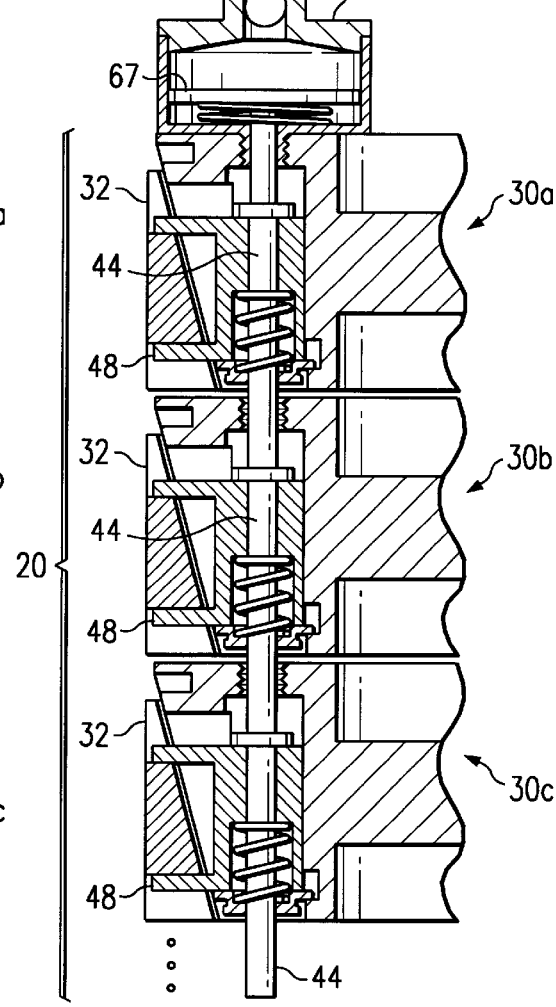
FIG. 6B provides a cut-away view of the assembly of heat conducting devices along section line 5—5 with the actuator engaged.

FIG. 6B provides a cut-away view of assembly 20 of heat conducting devices 30 along section line 5—5 with actuator 65 engaged. As before, engaging actuator 65 moves plunger 67 of actuator 65, moving plunger 44 of heat conducting device 30a. And again, this moves tensioner 48 and collar 32 of heat conducting device 30a. In this instance, however, plunger 44 of heat conducting device 30a also moves plunger 44 of heat conducting device 30b, which in turn moves plunger 44 of heat conducting device 30c, and so forth. Movement of plunger 44 of each heat conducting device 30b–30g moves tensioner 48 of each conducting device 30b–30g, which in turn moves collar 32 of each heat conducting device 30b–30g. The movement of collar 32 of each heat conducting device 30a–30g disengages collar 32 of each heat conducting device 30a–30g from airframe 12 of missile 10, creating a high impedance thermal path for high speed flight. Thus, actuator 65 can engage and disengage assembly 20 of heat conducting devices 30a–30g with airframe 12 of missile 10 by disengaging and engaging plunger 44 of heat conducting device 30a.

Although actuator 65 is shown as actuating all of heat conducting devices 30a–30g in assembly 20 simultaneously, a variety of other actuation devices exist that can actuate all of heat conducting devices 30a–30g in assembly 20 simultaneously. For example, screw 60 in FIG. 4B can actuate all of heat conducting devices 30 in assembly 20 simultaneously. Also, any of the previously discussed variations of actuator 65 can perform the same function. Thus, an actuation device that can simultaneously actuate all of heat conducting devices 30a–30g in assembly 20 can be any device that can move plunger 44 of heat conducting device 30a substantially perpendicular to thermal plane 36.

Figure 7A:
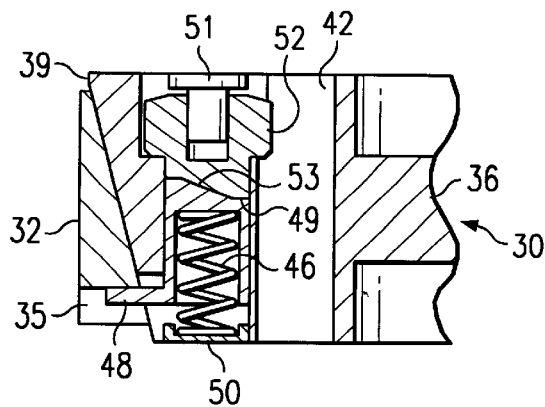
FIG. 7A illustrates another embodiment that can actuate the collar.

FIG. 7A illustrates another embodiment that can actuate collar 32. The actuation device in this embodiment is similar to the ones in the previously discussed embodiments, except that each tensioner 48 engages collar 32 in one notch 35 in collar 32. Also, a cam 52, rather than plunger 44, moves tensioner 48. Cam 52 possesses gear teeth around its largest outside diameter, which may be engaged in aperture 42 by an actuation device as described below. Further, tensioner 48 possesses a slanted surface 49 along which cam 52 engages tensioner 48. Cam 52 has a slanted surface 53 that corresponds to slanted surface 49 of tensioner 48. The embodiment further includes an additional retainer 51, which retains one end of cam 52.

As shown, collar 32 is engaged with airframe 12 (not shown). In this condition, spring 46 moves tensioner 48 away from retainer 50, toward cam 52, which floats freely between retainer 51 and tensioner 48. Providing space for cam 52 to float between retainer 51 and tensioner 48 allows for variations of airframe 12. Tensioner 48 moves collar 32 due to the engagement of tensioner 48 with collar 32 in notch 35. This movement causes the outer perimeter of heat conducting device 30 to expand as collar 32 moves along tapered outside perimeter 39 of thermal plane 36, engaging airframe 12.

Figure 7B:
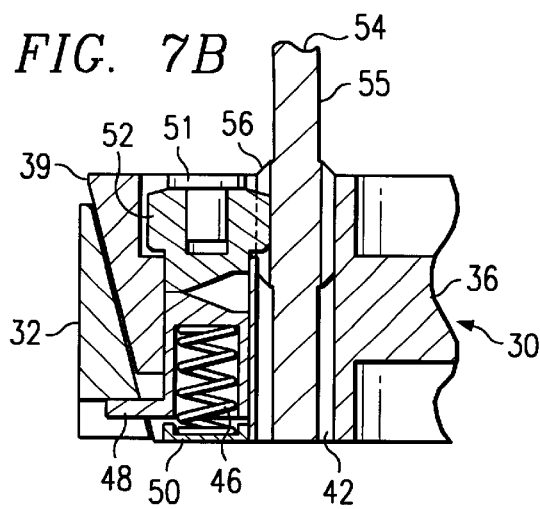
FIG. 7B illustrates the actuation of the collar for this embodiment.

FIG. 7B illustrates the actuation of collar 32 for this embodiment. A tool 54 serves as the actuation device. Tool 54 actuates collar 32 by engaging cam 52 in aperture 42. Tool 54 includes a shaft 55 that has a set of gear teeth 56 on a certain portion.

In operation, tool 54 inserts into aperture 42 until gear teeth 56 mesh with corresponding gear teeth of cam 52. Thus, when shaft 55 rotates around its longitudinal axis, cam 52 rotates. Starting with collar 32 engaging airframe 12, as shown in FIG. 7A, as cam 52 rotates, it engages retainer 51 and then begins to move tensioner 48 toward retainer 50, which compresses spring 46. As shown in FIG. 7B, tool 54 has rotated cam 52 to achieve the maximum movement of tensioner 48 toward retainer 50 by cam 52. The movement of tensioner 48 allows collar 32 to move along tapered outside perimeter 39 of thermal plane 36 toward retainer 50, which decreases the perimeter of heat conducting device 30, disengaging collar 32 from airframe 12.

In a particular embodiment, shaft 55 of tool 54 is long enough so that gear teeth 56 can extend through an associated aperture 42 of each heat conducting device 30 in assembly 20. Thus, tool 54 can actuate each cam 52 of each heat conducting device 30 in assembly 20 after installation of assembly 20 in missile 10.

The movement of collar 32 substantially perpendicular to thermal plane 36 has been illustrated, primarily, with tensioner 48, spring 46, and plunger 44 in aperture 42. However, there are a myriad of other ways to move collar 32 relative to thermal plane 36 along tapered outside diameter 39, such as a screw drive, a releasable spring, or a ratchet drive. Assembly 20 contemplates any mechanism for moving collar 32 relative to thermal plane 36 along tapered outside perimeter 39.

Moreover, in other embodiments, collar 32 and heat conducting device 36 would not require tapered inside perimeter 33 and tapered outside perimeter 39, respectively, to expand and contract the outer perimeter of heat conducting device 30. For instance, the outer perimeter can be expanded other than by moving collar 32 along tapered outside perimeter 39. This can be accomplished, for example, by pistons that can engage collar 32 with airframe 12 by pushing collar 32 away from the center of thermal plane 36. In such embodiments, thermal plane 36 and collar 32 would not necessarily have tapered outside perimeter 39 and tapered inside perimeter 33, respectively. Thus, assembly 20 contemplates any suitable mechanisms, and associated configurations of collar 32 and thermal plane 36, that can engage collar 32 to expand the perimeter of heat conducting device 30.

Figure 8:
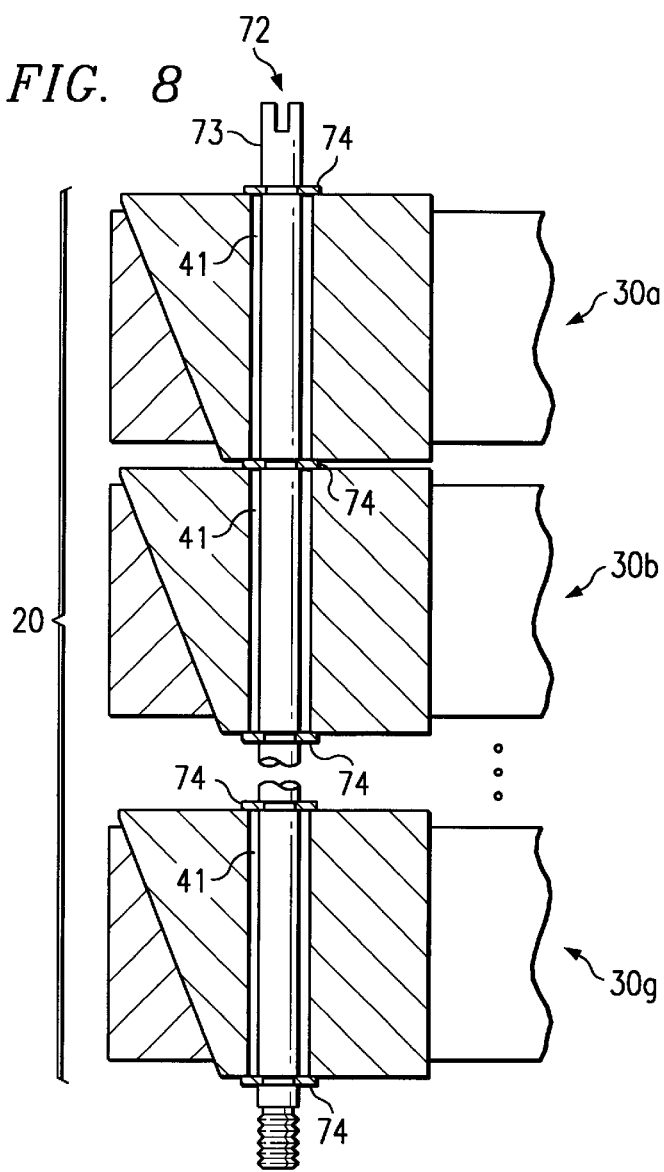
FIG. 8 provides a cut-away view of the assembly of heat conducting devices along section line 7–7 that illustrates a fastener assembly for coupling the heat conducting devices together.

FIG. 8 provides a cut-away view of assembly 20 of heat conducting devices 30a–30g along section line 7–7 that illustrates a fastener assembly 72 for coupling heat conducting devices 30a–30g in assembly 20 together. Fastener assembly 72 includes e-clips 74 and an elongated member 73, which extends through apertures 41 in heat conducting devices 30a–30g. E-clips 74 fit into grooves machined in elongated member 73, capturing elongated member 73 on either side of each heat conducting device 30a–30g. Fastener assembly 72 maintains minimum spacing requirements between each heat conducting device 30a–30g while allowing each heat conducting device 30a–30g to have some movement independent of other heat conducting devices 30 in assembly 20. Independent lateral movement allows each heat conducting device 30a–30g to independently center in missile 10 while engaging with airframe 12 of missile 10.

In a particular embodiment, elongated member 73 is a rod with threads formed at one of its ends. The threads allow elongated member 73, and hence assembly 20, to mount to a bulkhead of missile 10.

In other embodiments, assembly 20 can mount to missile 10 by struts, spars, or any other structural support. In addition, fastener assembly 72 can be shafts on each heat conducting device 30 that lock into chambers on adjacent heat conducting devices 30, corresponding tabs and locking slots on each heat conducting device 30, or any other device that will allow a plurality of heat conducting devices 30 to couple together to form assembly 20.

The operation of heat conducting device 30 has been described, at least in part, with respect to missiles, and in particular air-to-air missiles, e.g., captive flight and free flight. However, heat conducting device 30, or assembly 20, could also be useful in other aircraft/spacecraft, such as surface-to-air missiles, air-to-surface missiles, reentry vehicles, satellites, or any other vehicle that possesses electronics from which heat must be dissipated and that experiences varying external thermal loading from which the electronics must be protected.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A heat conducting device for providing an adjustable thermal path between a circuit board and an airframe, comprising:
   a thermal plane adapted to receive a circuit board;
   a collar encompassing at least a portion of the thermal plane, the collar adjustable between a first position disengaged from at least a portion of the airframe to provide a high impedance thermal path between the circuit board and the airframe, and a second position engaging at least a portion of the airframe to provide a thermal path between the circuit board and the airframe; and
   an actuation device engaging the thermal plane and the collar to adjust the collar between the first position and the second position.

2. The heat conducting device of claim 1, wherein:
   the thermal plane comprises a tapered outside perimeter; and
   the collar comprises a tapered inside perimeter.

3. The heat conducting device of claim 1, wherein the actuation device further comprises a plurality of tensioners operable to move the collar substantially perpendicular to the thermal plane.

4. The heat conducting device of claim 1, wherein the actuation device comprises a pneumatic actuator.

5. The heat conducting device of claim 1:
   wherein the airframe comprises an airframe of a missile; and
   the actuation device operates to place the collar in the first position for free flight of the missile.

6. A method for providing an adjustable thermal path between a circuit board and an airframe, comprising:
   mounting a circuit board on a thermal plane;
   positioning a collar around at least a portion of the thermal plane;
   adjusting the collar to a first position disengaged from at least a portion of the airframe to provide a high impedance thermal path between the circuit board and the airframe; and
   adjusting the collar to a second position engaging at least a portion of the airframe to provide a thermal path between the circuit board and the airframe.

7. The method of claim 6, wherein adjusting the collar comprises moving the collar substantially perpendicular to the thermal plane.

8. The method of claim 6, wherein:
   the thermal plane comprises a tapered outside perimeter; and
   the collar comprises a tapered inside perimeter.

9. The method of claim 6, further comprising mounting the thermal plane in the airframe after adjusting the collar to the first position before adjusting the collar to the second position.

10. The method of claim 6, further comprising adjusting the collar to the first position for free flight.

11. An assembly for providing adjustable thermal paths between a plurality of circuit boards and an airframe, comprising:
    a plurality of heat conducting devices, each heat conducting device comprising:
       a thermal plane adapted to receive a circuit board;
       a collar encompassing at least a portion of the thermal plane, the collar adjustable between a first position disengaged from at least a portion of the airframe to provide a high impedance thermal path between the circuit board and the airframe, and a second position engaging at least a portion of the airframe to provide a thermal path between the circuit board and the airframe;
       an actuation device engaging the thermal plane and the collar to adjust the collar between the first position and the second position; and
    a fastener assembly to couple the heat conducting devices together.

12. The assembly of claim 11, wherein the actuation device of each heat conducting device further comprises a plurality of tensioners operable to move the associated collar substantially perpendicular to the associated thermal plane.

13. The assembly of claim 11, wherein:
    each thermal plane further comprises a tapered outside perimeter; and
    each collar further comprises a tapered inside perimeter.

14. The assembly of claim 11, wherein each collar is adjustable between the first position and the second position independently of the other collars.

15. The assembly of claim 11:
    wherein the airframe comprises an airframe of a missile; and
    the actuation device operates to place the collars in the first position during free flight of the missile.

16. The assembly of claim 11, wherein:
    each thermal plane includes an aperture; and
    the fastener assembly further comprises an elongated member passing through the aperture in each thermal plane to couple the heat conducting devices together.

17. The assembly of claim 16, wherein the elongated member secures the plurality of heat conducting devices to the airframe.

* * * * *